United States Patent
Shimizu et al.

(10) Patent No.: US 11,385,756 B2
(45) Date of Patent: Jul. 12, 2022

(54) INPUT DEVICE

(71) Applicant: KABUSHIKI KAISHA TOKAI RIKA DENKI SEISAKUSHO, Aichi (JP)

(72) Inventors: Tomomi Shimizu, Aichi (JP); Kenji Murata, Aichi (JP); Keita Nakane, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 17/423,654

(22) PCT Filed: Feb. 21, 2020

(86) PCT No.: PCT/JP2020/007189
§ 371 (c)(1),
(2) Date: Jul. 16, 2021

(87) PCT Pub. No.: WO2020/195436
PCT Pub. Date: Oct. 1, 2020

(65) Prior Publication Data
US 2022/0121300 A1    Apr. 21, 2022

(30) Foreign Application Priority Data
Mar. 26, 2019  (JP) .............................. JP2019-059352

(51) Int. Cl.
*G06F 3/046* (2006.01)
(52) U.S. Cl.
CPC .... *G06F 3/046* (2013.01); *G06F 2203/04105* (2013.01)

(58) Field of Classification Search
CPC ..................... G06F 3/046; G06F 3/044; G06F 2203/04105; G06F 3/041; B06B 1/04; H01H 13/00; H01H 13/02
See application file for complete search history.

(56) References Cited

U.S. PATENT DOCUMENTS

| | | | |
|---|---|---|---|
| 10,700,262 | B2 | 6/2020 | Kishimoto |
| 2017/0256701 | A1 | 9/2017 | Kishimoto |
| 2019/0094973 | A1* | 3/2019 | Miller ..................... G06F 3/016 |
| 2020/0097086 | A1* | 3/2020 | Bushnell ................ H04R 9/045 |

FOREIGN PATENT DOCUMENTS

| | | |
|---|---|---|
| JP | 2015-082184 A | 4/2015 |
| WO | 2012/169138 A1 | 12/2012 |

OTHER PUBLICATIONS

International Search Report (including English Language Translation), dated Apr. 14, 2020 by the Japan Patent Office (JPO), in International Application No. PCT/JP2020/007189.

* cited by examiner

*Primary Examiner* — Lisa S Landis
(74) *Attorney, Agent, or Firm* — Greenblum & Bernstein, P.L.C.

(57) ABSTRACT

An input device includes an operation unit to receive an operation, the operation unit including a magnetic member having a magnetic property, at least one load detection unit to detect a load on the operation unit and detect the load according to capacitance between a pair of conductors, a substrate on which an electrode as one of the pair of conductors of the load detection unit is arranged, and a drive unit including a coil to generate a magnetic field for driving the magnetic member. The coil is arranged on the substrate.

10 Claims, 5 Drawing Sheets

INPUT DEVICE

CROSS-REFERENCES TO RELATED APPLICATIONS

The present patent application claims the priority of Japanese patent application No. 2019/059352 filed on Mar. 26, 2019, and the entire contents of Japanese patent application No. 2019/059352 are hereby incorporated by reference.

TECHNICAL FIELD

The present invention relates to an input device.

BACKGROUND ART

An input device is known which includes a movable panel having a touch pad provided on a surface of an operation unit to detect an operation position according to capacitance, and a vibration providing mechanism that drives the movable panel by a motor (see, e.g., Patent Literature 1).

The input device in Patent Literature 1 has a moving pin that moves in a first direction; a force applying unit that applies a force to the moving pin in the first direction; an operation unit that moves in a second direction different from the first direction; and a guide groove that is provided on the operation unit and includes a first groove which is provided so that the operation unit is kept in a neutral position when the operation unit is not operated and the force applied from the moving pin in the first direction acts as a reaction force against the operation when the operation unit is operated in the second direction, and a second groove which is provided so that the force applied from the moving pin in the first direction is provided as a tactile sensation in the second direction at the time of providing a tactile sensation on the operation unit.

CITATION LIST

Patent Literature

Patent Literature 1: JP 2015/82184 A

SUMMARY OF INVENTION

Technical Problem

The input device of Patent Literature 1 includes both an operation position detection mechanism and a vibration providing mechanism as independent structures. That is, in the input device of Patent Literature 1, a problem may arise that the device is complicated in structure with many components.

It is an object of the invention to provide an input device that can be reduced in the number of components thereof.

Solution to Problem

According to an embodiment of the invention, an input device according to [1] to [10] below is provided.
[1] An input device, comprising:
  an operation unit to receive an operation, the operation unit comprising a magnetic member having a magnetic property;
  at least one load detection unit to detect a load on the operation unit and detect the load according to capacitance between a pair of conductors;
  a substrate on which an electrode as one of the pair of conductors of the load detection unit is arranged; and
  a drive unit comprising a coil to generate a magnetic field for driving the magnetic member,
  wherein the coil is arranged on the substrate.
[2] The input device as defined in [1], wherein the drive unit comprises the coil and a yoke through which the magnetic field generated by the coil passes.
[3] The input device as defined in [1] or [2], wherein the load detection unit comprises the electrode, an operation deformation portion to deform in response to an operation on the operation unit, and a detection electrode as the other of the pair of conductors, and the electrode, the operation deformation portion and the detection electrode are located between the substrate and the operation unit and arranged in this order from the substrate.
[4] The input device as defined in any one of [1] to [3], further comprising an elastic deformation portion between the operation unit and the detection electrode.
[5] The input device as defined in any one of [1] to [4], wherein the operation deformation portion is configured to elastically deform.
[6] The input device as defined in [5], wherein the operation deformation portion comprises a silicone gel.
[7] The input device as defined in any one of [1] to [6], wherein the substrate is supported by a housing.
[8] The input device as defined in any one of [1] to [6], wherein the substrate is supported by the housing via a support member having elasticity.
[9] The input device as defined in any one of [1] to [8], wherein the electrode and the coil are arranged on the same surface of the substrate.
[10] The input device as defined in any one of [1] to [9], further comprising a control unit that determines whether or not an operation is performed on the operation based on the load on the operation unit detected by the load detection unit, and causes the drive unit to drive the magnetic member when an operation is performed on the operation.

Advantageous Effects of Invention

According to an embodiment of the invention, an input device can be provided that can be reduced in the number of components thereof.

DESCRIPTION OF EMBODIMENTS

Embodiments of the Invention

Figure 1:
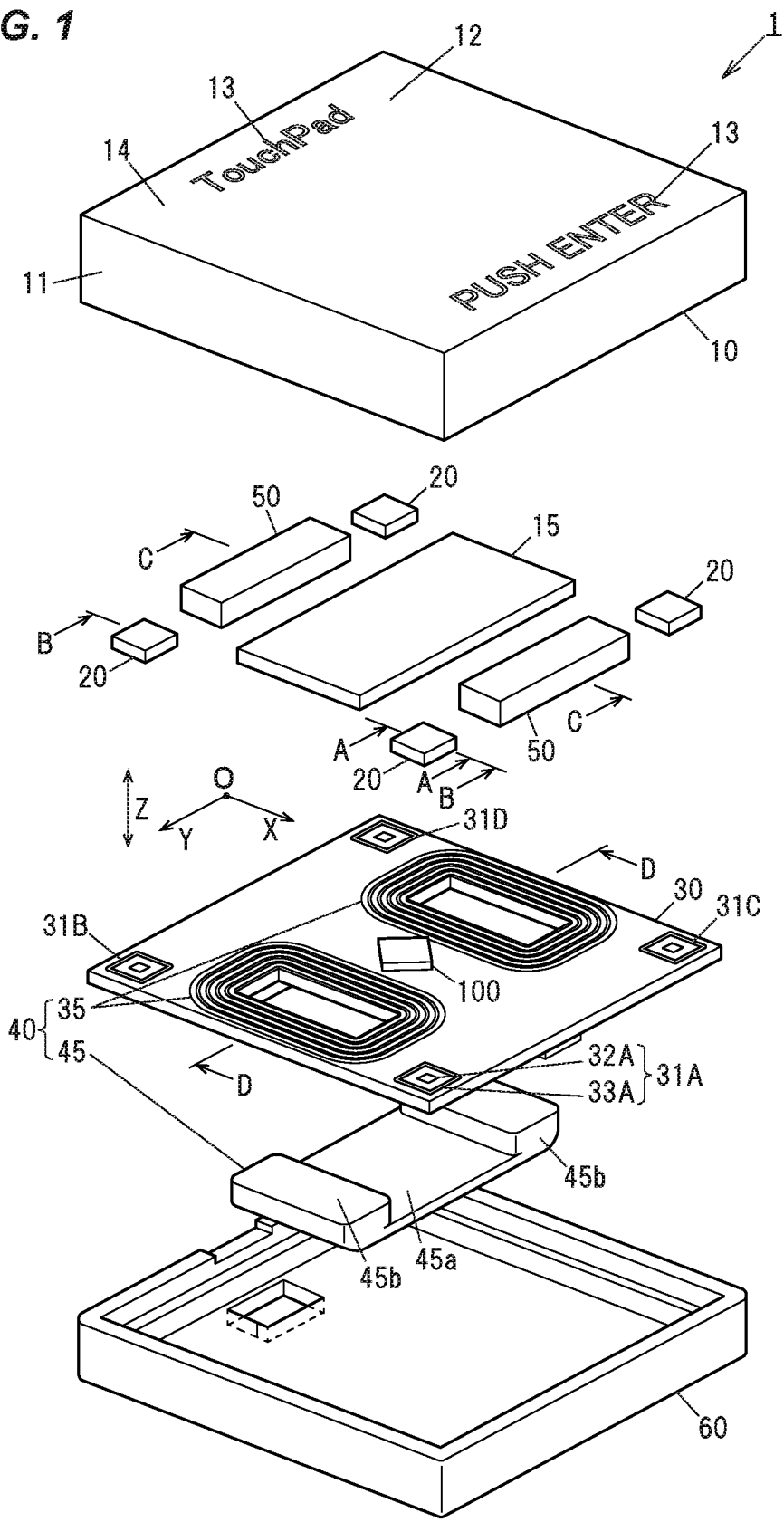
FIG. 1 is an exploded perspective view showing an input device in an embodiment of the present invention.

An input device 1 in embodiments of the invention includes an operation unit 10 to receive an operation, the operation unit including a magnetic member 15 having a magnetic property, at least one load detection unit 25 to detect a load on the operation unit 10 and detect the load according to capacitance between a pair of conductors, a substrate 30 on which an electrode 31 as one of the pair of conductors of the load detection unit 25 is arranged, and a drive unit 40 including a coil 35 to generate a magnetic field for driving the magnetic member 15, wherein the coil 35 is arranged on the substrate 30. In the present embodiments, the load detection units 25 are arranged at four corners of the substrate 30, as shown in FIG. 1.

(Configuration in the First Embodiment)

Figure 3A:
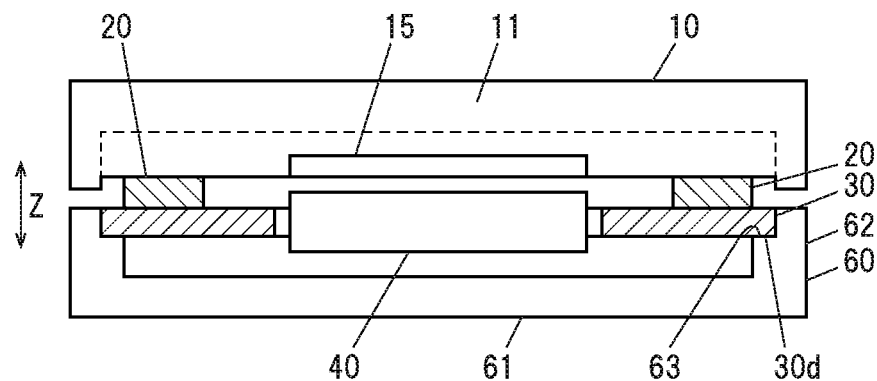
FIG. 3A is a cross-sectional view showing the input device in the first embodiment when taken along B-B in FIG. 1.

The configuration in the first embodiment will be described. The operation unit 10 is supported by the substrate 30 via supports 20, as shown in FIG. 3A. The substrate 30 is supported by and fixed to a housing 60. When the magnetic member 15 provided on the operation unit 10 receives a magnetic driving force (a magnetic attraction force) from the drive unit 40, the operation unit 10 is displaced in a vertical direction Z shown in FIG. 1 and FIG. 3A via vertical expansion and contraction of the supports 20 and vibration thereby can be provided.

In the first embodiment, the support 20 has an elastic deformation portion 23 formed of an elastic material and located between the operation unit 10 and an operation deformation portion 21. As an example, the elastic deformation portion 23 is formed of a silicone gel and has two functions—making the operation unit 10 easy to vibrate and improving sensitivity of detecting an operation amount of the operation unit 10.

(The Operation Unit 10)

The operation unit 10 includes an operation panel 11 receiving an operation such as pressing or pushing down that is performed by an operator and generates an operation load. The operation panel 11 also has a function of providing vibration to the operator who operates the operation panel 11 by means of receiving a drive force such as vibration generated by the drive unit 40 (described later).

Figure 2A:
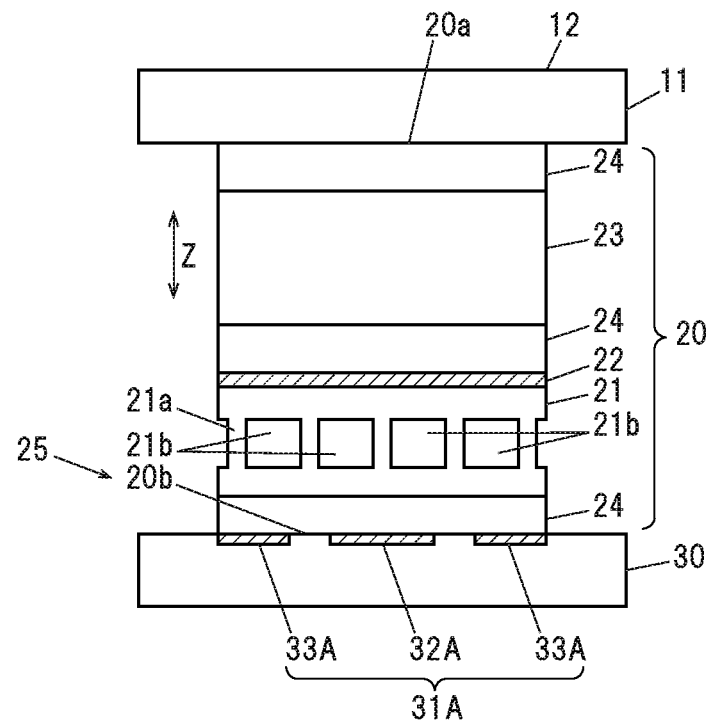
FIG. 2A is a partial cross-sectional view showing the input device in the embodiment of the invention when taken along A-A in FIG. 1.

The operation unit 10 is supported on the substrate 30 by the supports 20, as shown in FIGS. 2A and 3A. Since the supports 20 are elastically deformable in the vertical direction Z shown in FIG. 2A, the operation unit 10 can move in the vertical direction Z via vertical expansion and contraction of the supports 20 by receiving a drive force such as vibration generated by the drive unit 40.

Figure 3B:
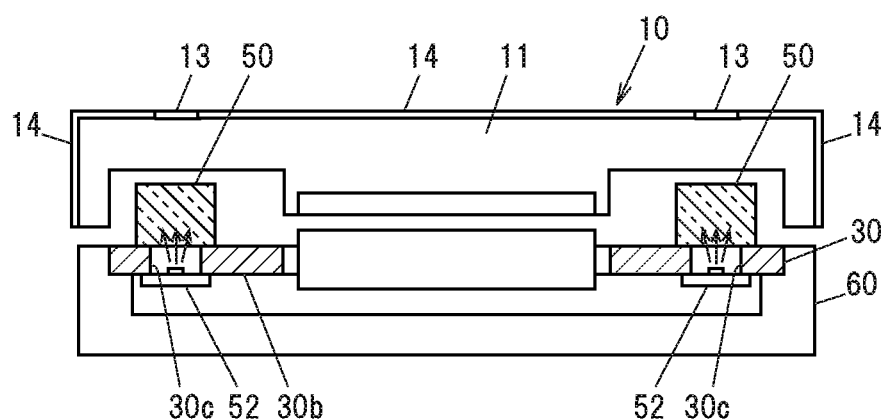
FIG. 3B is a cross-sectional view when taken along C-C in FIG. 1.

A surface 12 of the operation panel 11 functions as an operation surface to be pressed or pushed down, etc. by the operator, and can also have a display function. The operation panel 11 is formed of, e.g., a light-transmitting acrylic material, and has a display portion 13 such as characters as shown in FIG. 1, symbols or shapes formed thereon. The display portion 13 is formed of, e.g., characters with opaque outlines as shown in FIGS. 1 and 3B, and the region other than the display portion 13 is painted black and formed as an opaque portion 14 so that only the inside of the outlines of the characters transmits light. Thus, guided light from light guide members 50 (light guides, be described later) exits only from the display portion 13 and illuminates the display portion 13, resulting in that characters, symbols or shapes, etc., are illuminated and displayed.

Figure 3C:
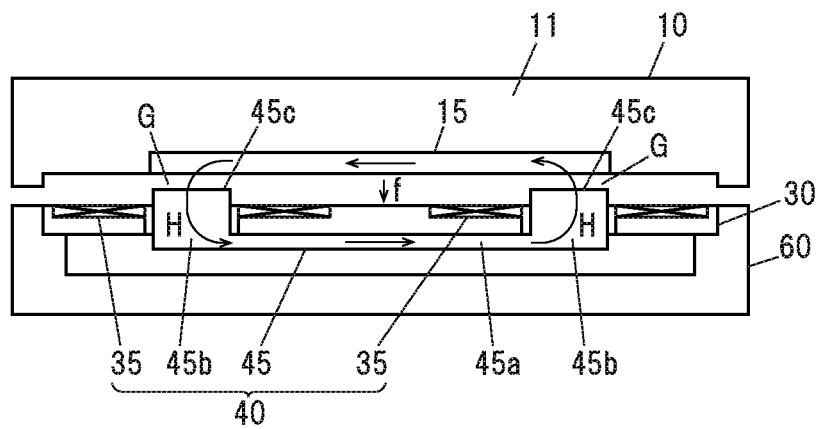
FIG. 3C is a cross-sectional view when taken along D-D in FIG. 1.

The magnetic member 15 is attached to a back surface of the operation panel 11, as shown in FIGS. 3A to 3C. The magnetic member 15 has, e.g., a plate shape and is formed of a soft magnetic material that receives a magnetic driving force (a magnetic attraction force) from the drive unit 40 (a solenoid). It can be formed using, e.g., pure iron, soft iron, electromagnetic steel or electromagnetic stainless steel, etc.

(The Support 20)

The support 20 is composed of the operation deformation portion 21, a detection electrode 22 and the elastic deformation portion 23 which are stacked, as shown in FIG. 2A. The elastic deformation portion 23 and the detection electrode 22 are bonded by an adhesive layer 24. The detection electrode 22 is formed of a carbon material (described later) and is thus a carbon layer directly formed on the operation deformation portion 21. By the adhesive layers 24, the operation deformation portion 21 is bonded to the substrate 30 and the elastic deformation portion 23 to the operation panel 11.

The detection electrode 22 and the operation deformation portion 21 may also be bonded by the adhesive layer 24. Alternatively, for example, adhesive members using a resin plate of PET, etc., as a base material may be provided instead of the adhesive layers 24, and in this case, the adhesive members bond the operation deformation portion 21 to the detection electrode 22, the operation deformation portion 21 to the substrate 30, and the elastic deformation portion 23 to the operation panel 11.

The support 20 is configured as a sensor sheet in which the elastic deformation portion 23, the detection electrode 22 and the operation deformation portion 21 are sequentially stacked and both end surfaces 20a, 20b serve as attachment surfaces or bonding surfaces respectively to the operation unit 10 and the substrate 30. The support 20 is arranged and attached so that the end surface 20b is located on the electrode 31 (electrode 31A, 31B, 31C, 31D).

(The Operation Deformation Portion 21)

Figure 4:
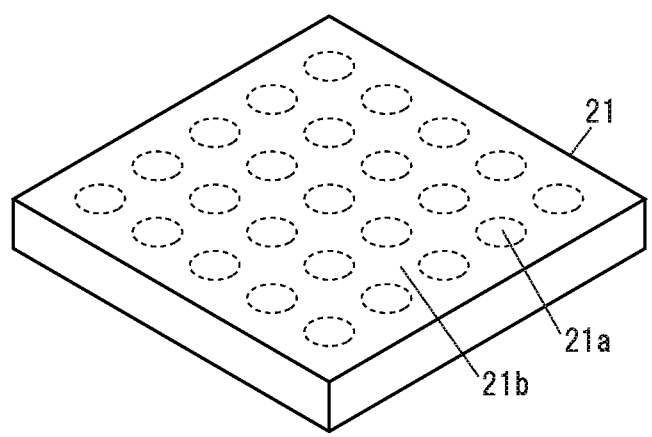
FIG. 4 is a three-dimensional perspective view showing an operation deformation portion.

The operation deformation portion 21 is formed of an elastically deformable member, e.g., a silicon material 21a such as silicone gel, is formed in a sheet shape with plural spaces divided in a grid pattern, and has air gap portions 21b each of which is in a space between the grid lines and encloses air, as shown in FIGS. 2A and 4. The operation deformation portion 21 in the first embodiment is, e.g., in a sheet shape having the air gap portions 21b inside gaps formed on the lines of the 5×5 grid-shaped silicon material 21a, as shown in FIG. 4. The operation deformation portion 21 deforms under an operation load generated by operating the operation unit 10 and also deforms when the operation unit 10 is vibratory driven.

Figure 5:
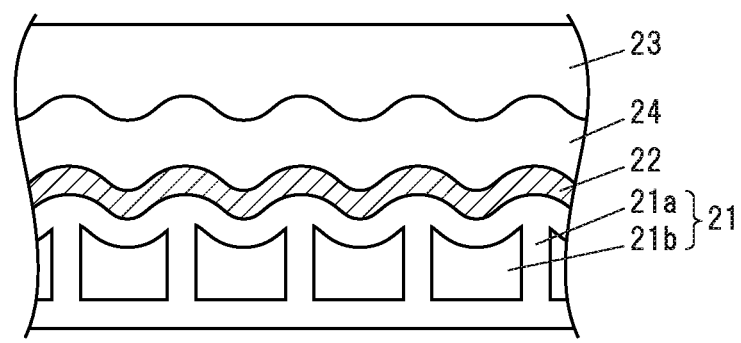
FIG. 5 is a schematic cross-sectional view for explaining improvement in detection sensitivity by the operation deformation portion.

As shown in FIG. 5, when the operation deformation portion 21 receives a load due to the operation load, regions above the dot-shaped air gap portions 21b are largely deformed, and since the detection electrode 22 is also deformed, an inter-electrode distance between the detection electrode 22 and the electrode 31 is reduced. Thus, a distance change rate increases even when an amount of change in distance with respect to the load is the same, hence, an amount of change in capacitance increases and detection sensitivity is improved.

(The Detection Electrode 22)

The detection electrode 22 is paired with the electrode 31 to detect the operation amount of the operation unit 10. In particular, a capacitance value between the electrode 31 and the detection electrode 22 is detected by the self-capacitance method, and based on this, the operation load on the operation unit 10 is detected (calculated). That is, the electrode 31 and the detection electrode 22 (the electrode 31 and the support 20) constitute a detection unit for detecting capacitance and operation load. Such detection units are arranged at plural locations on the substrate 30. The detection electrode 22 is a conductive layer formed of carbon, but a material other than carbon can be used as long as it has conductivity. Such a detection electrode 22 is paired with the electrode 31 and forms a capacitor by capacitive coupling.

The at least one load detection unit 25 is a load detection unit for detecting a load on the operation unit 10 and detects the load according to capacitance between a pair of conductors. The load detection unit 25 includes the electrode 31, the operation deformation portion 21 that deforms in response to an operation on the operation unit, and the detection electrode 22 as the other of the pair of conductors, and it is configured that the electrode 31, the operation deformation portion 21 and the detection electrode 22 are located between the substrate 30 and the operation unit 10 and are arranged in this order from the substrate 30.

The support 20 is compressed by a pressing operation, etc., on the operation panel 11. At this time, in the capacitor formed by the detection electrode 22 and the electrode 31, a facing area S and a relative permittivity c do not change and only a distance d between the two electrodes changes. Therefore, the operation amount to the operation panel 11 can be detected as a capacitance value corresponding to the distance between the electrodes in the capacitor and can be converted and calculated as a value of the operation load.

(The Elastic Deformation Portion 23)

The elastic deformation portion 23 is formed of an elastic member or a viscoelastic member. The elastic deformation portion 23 is formed of, e.g., a silicone gel and has a sheet shape, as shown in FIG. 2A. The elastic deformation portion 23 can be made suitable for the first embodiment by setting the Young's modulus or penetration, etc., in addition to the thickness or the width size. The elastic deformation portion 23 has two functions—making the operation unit 10 easy to vibrate and improving sensitivity of detecting the operation amount of the operation unit 10.

Another Example

Figure 2B:
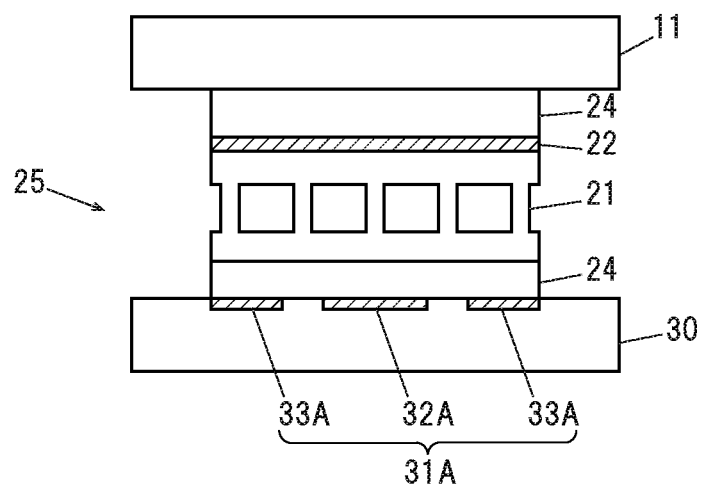
FIG. 2B is a partial cross-sectional view showing a modification when taken along A-A in FIG. 1.

FIG. 2B is another example of the configuration of the support 20. The support 20, even when not having a configuration without the elastic deformation portion 23 described above, is also applicable in the first embodiment.

That is, the support 20 is composed of the operation deformation portion 21 and the detection electrode 22 which are stacked, as shown in FIG. 2B. The detection electrode 22 is formed of a carbon material and is thus a carbon layer directly formed on the operation deformation portion 21. By the adhesive layers 24, the operation deformation portion 21 is bonded to the substrate 30 and the detection electrode 22 to the operation panel 11.

The detection electrode 22 and the operation deformation portion 21 may also be bonded by the adhesive layer 24. Alternatively, for example, adhesive members using a resin plate of PET, etc., as a base material may be provided instead of the adhesive layers 24, and in this case, the adhesive members bond the operation deformation portion 21 to the detection electrode 22, the operation deformation portion 21 to the substrate 30, and the detection electrode 22 to the operation panel 11.

In this example, the operation deformation portion 21 deforms under an operation load generated by operating the operation unit 10 and also deforms when the operation unit 10 is vibratory driven. In addition, since the adhesive layers 24 are provided at two or three locations and have elasticity or viscoelasticity, the adhesive layers 24 can exert the same effect as that of the elastic deformation portion 23.

(The Substrate 30)

The substrate 30 is a rigid substrate and can be, e.g., an epoxy substrate or a glass epoxy substrate, etc. The substrate 30 is arranged such that an edge 30d is fixed to a support portion 63 of the housing 60, as shown in FIG. 3A, etc.

The substrate 30 includes a first pattern constituting the electrode 31 and a second pattern as the coil 35 constituting the drive unit 40. That is, one substrate is used for the operation position detection mechanism and the vibration providing mechanism, and the pattern required for each mechanism is formed on the substrate 30.

(The Electrode 31)

In the first embodiment, the electrodes 31 as the electrodes 31A, 31B, 31C, 31D are formed as the first pattern and arranged at the four corners of the substrate 30, as shown in FIG. 1. The electrode 31 and the coil 35 are arranged on the same surface of the substrate 30. In the first embodiment, the electrode 31 and the coil 35 are arranged on an upper surface 30a of the substrate 30, as shown in FIGS. 1 and 6.

The electrode 31A as the electrode 31 is, e.g., a copper pattern, etc., formed on the upper surface 30a of the substrate 30, as shown in FIGS. 1 and 2A. The electrode 31A is composed of, e.g., a sensor electrode 32A and a ground electrode 33A formed therearound.

Figure 6:
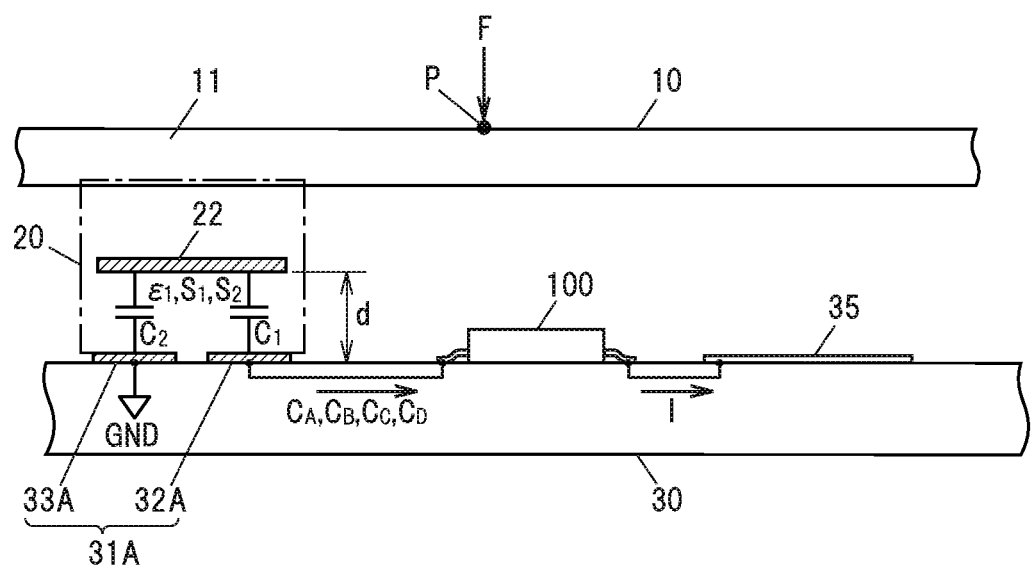
FIG. 6 is a partial schematic configuration cross-sectional view showing a drive coil of a drive unit, a control unit, and a capacitive coupling between an electrode and a detection electrode.

As shown in FIG. 6, the sensor electrode 32A is connected to a control unit 100 and the ground electrode 33A is connected to ground (GND). Thus, the sensor electrode 32A and the detection electrode 22, and the detection electrode 22 and the ground electrode 33A, are respectively capacitively coupled and constitute capacitors $C_1$ and $C_2$. That is, one end of the capacitor $C_1$ is connected to the control unit 100, the other end of the capacitor $C_1$ is connected to one end (the detection electrode 22) of the capacitor $C_2$, and the other end of the capacitor $C_2$ is connected to the ground (GND).

Here, as shown in FIG. 6, the capacitors $C_1$, $C_2$ respectively have facing areas $S_1$, $S_2$ between capacitor electrodes and also have a common relative permittivity E, and these values are constant values. On the other hand, the distance d between the capacitor electrodes changes according to the operation amount (the operation load) since the support 20 is deformed by a pressing or push-down operation onto the operation panel 11.

The capacitance values of the capacitors $C_1$, $C_2$ can be respectively expressed by $C_1 = \varepsilon S_1/d$ and $C_2 = \varepsilon S_2/d$. That is, the combined capacitance value C is:

$$C = C_1 \cdot C_2/(C_1+C_2) = (\varepsilon/d) \cdot ((S_1 \cdot S_2)/(S_1+S_2))$$

Since the distance d changes according to the operation amount (an operation load F at an operation point P shown in FIG. 6) by a pressing or push-down operation onto the operation panel 11, the detected capacitance value C also changes according to the operation amount (the operation load). In the first embodiment, since the electrodes 31A, 31B, 31C, 31D are arranged at four corners as shown in FIG.

1, the detection units located at four corners of the substrate and respectively composed of the electrodes 31A, 31B, 31C, 31D and the detection electrodes 22 detect capacitance values $C_A$, $C_B$, $C_C$, $C_D$ and input them to the control unit 100.

(The Coil 35)

The coil 35 is composed of series-connected coils of the same shape and is formed as the second pattern on the substrate 30, as shown in FIGS. 1 and 3C. The coil 35 generates a magnetic field when a current I is supplied. The coil 35 is a copper pattern, etc., formed on the substrate 30 so as to have a spiral shape. To increase the number of coil turns, the total number of coil turns can be set to a large value by using a multilayer substrate as the substrate 30 so that the patterns are stacked.

Since the coil 35 is formed as the second pattern on the substrate 30 and has a substantially substrate thickness, it is advantageous in reducing the thickness of the input device.

Alternatively, the coil 35 can be configured as a flat coil formed by spirally winding a magnet wire such as an enameled wire and attached to substrate 30, instead of being formed by the copper pattern, etc., as described above.

(The Drive Unit 40)

The drive unit 40 is a solenoid composed of the coil 35 and a yoke 45 through which the magnetic field generated by the coil 35 passes. Since the coil 35 is formed in a spiral shape, a magnetic field H passing through the center of the coil 35 as shown in FIG. 3C is generated by supplying a current to the coil 35.

As shown in FIGS. 1 and 3C, the yoke 45 includes a yoke main body 45a and side yokes 45b that rise upright at both sides of the yoke main body 45a and are inserted into the coil 35. The yoke 45 is formed of, e.g., a soft magnetic material such as soft iron or silicon steel. The yoke 45 is arranged such that, e.g., the yoke main body 45a is fixed to the substrate 30.

An end portion 45c of the side yoke 45b is located at a predetermined distance from the magnetic member 15. An air gap G is formed between the end portion 45c and the magnetic member 15.

When a current is supplied to the coil 35 and the magnetic field H of the solenoid is generated, the magnetic field H forms a magnetic path through the side yoke 45b, the yoke main body 45a, the side yoke 45b, the air gap G, the magnetic member 15, the air gap G, and the side yoke 45b, as shown in FIG. 3C. As a result, a force f of attraction toward the yoke 45 acts on the magnetic member 15. This force f of attraction is a drive force of the operation unit 10 (the operation panel 11) and can drive the operation unit 10 (the operation panel 11) downward against the operation deformation portion 21 and the elastic deformation portion 23, thereby providing vibration.

The housing 60 is composed of a main body 61, a side wall 62 rising upright from the periphery of the main body 61, and the support portion 63 formed at an edge 64 of the main body 61 by providing a level difference. The housing 60 only needs to be formed of a material having rigidity capable of supporting the operation unit 10, the substrate 30 and the drive unit 40, etc., and can be formed using, e.g., a resin or a metal, etc.

(The Light Guide Member 50)

The light guide members 50 are light guides that guide light from a light source to an illumination target. The light guide members 50 are arranged between the substrate 30 and the operation unit 10 and guide light to the display portion 13 that is a display region provided on the operation panel 11 of the operation unit 10. For the light guide member 50, it is possible to use a material that transmits visible light, such as acrylic.

As shown in FIG. 3B, for example, LED elements 52 are mounted on a lower surface 30b of the substrate 30 and light exits from holes 30c to the light guide members 50. Light incident on the light guide members 50 is guided and illuminates the operation panel 11. The display portion 13 of the operation panel 11 is formed of characters with opaque outlines as shown in FIG. 3B, and the region other than the display portion 13 is painted black and formed as the opaque portion 14 so that only the inside of the outlines of the characters transmits light. Thus, guided light from the light guide members 50 exits only from the display portion 13 and illuminates the display portion 13, resulting in that characters, symbols or shapes, etc., are illuminated and displayed.

(The Control Unit 100)

The control unit 100 is, e.g., a microcomputer composed of a CPU (Central Processing Unit) performing calculation and processing, etc., of the acquired data according to a stored program, and a RAM (Random Access Memory) and a ROM (Read Only Memory) as semiconductor memories, etc. The ROM stores, e.g., a program for operation of the control unit 100. The RAM is used as, e.g., a storage area for temporarily storing calculation results, etc.

The control unit 100 controls detection of the capacitance values by the detection units located at the four corners of the substrate and respectively composed of the electrodes 31A, 31B, 31C, 31D and the detection electrodes 22, and also controls so that operation loads $F_A$, $F_B$, $F_C$, $F_D$ caused by a pressing or push-down operation on the operation panel 11 are calculated based on the detection values. Then, a coordinate detection operation when the operation panel 11 is operated is performed based on the operation loads $F_A$, $F_B$, $F_C$, $F_D$. In addition, the drive unit 40 is driven and controlled by controlling the current supply to the coil 35 and vibration provision is controlled by driving the operation unit 10

(The Operation Panel 11)

(Coordinate detection operation when the operation panel 11 is operated)

As shown in FIG. 1, when the plane coordinates on the operation panel 11 and the substrate 30 are denoted using X and Y, the XY coordinates of the electrodes 31A, 31B, 31C, 31D are respectively given as coordinates $(X_A, Y_A)$, $(X_B, Y_B)$, $(X_C, Y_C)$ and $(X_D, Y_D)$.

At the coordinates $(X_A, Y_A)$, $(X_B, Y_B)$, $(X_C, Y_C)$ and $(X_D, Y_D)$, i.e., at the four corners of the substrate, the control unit 100 supplies electric charge at a predetermined timing to the sensor electrodes 32A, 32B, 32C, 32D of the detection units respectively composed of the electrodes 31A, 31B, 31C, 31D and the detection electrodes 22, and detects the respective capacitance values $C_A$, $C_B$, $C_C$ and $C_D$ by measuring the amount of electric charge. As described above, the capacitance values $C_A$, $C_B$, $C_C$ and $C_D$ correspond to the operation amount (the operation load F at the operation point P shown in FIG. 6) by a pressing or push-down operation onto the operation panel 11. Therefore, the operation loads $F_A$, $F_B$, $F_C$, $F_D$ at the positions of the coordinates $(X_A, Y_A)$, $(X_B, Y_B)$, $(X_C, Y_C)$ and $(X_D, Y_D)$ can be respectively calculated based on the Young's modulus, etc., of the operation deformation portion 21 and the elastic deformation portion 23.

(Determination of Pressing or Push-Down Operation)

Based on the operation loads $F_A$, $F_B$, $F_C$, $F_D$, the control unit 100 can determine whether or not a pressing or push-down operation has been performed on the operation panel 11. By comparing a preset operation load threshold $F_{th}$ to, e.g., an average of the operation loads $F_A$, $F_B$, $F_C$, $F_D$, or the largest value among the operation loads $F_A$, $F_B$, $F_C$, $F_D$, or an operation load value corresponding to the position of the center of gravity of the operation load (described later), etc., it is possible to determine whether or not a pressing or push-down operation has been performed on the operation panel 11.

(Detection of the Coordinates of the Operation Point)

The control unit 100 can detect the coordinates of the operation point P by calculating, e.g., the position of the center of gravity of the operation load based on the operation loads $F_A$, $F_B$, $F_C$, $F_D$.

The coordinates ($X_G$, $Y_G$) of this center of gravity of the operation load are calculated using the operation loads $F_A$, $F_B$, $F_C$, $F_D$ in the following equations (1) and (2), as an example. The respective coordinates on the XY-plane shown in FIG. 1 are ($X_A$, $Y_A$), ($X_B$, $Y_B$), ($X_C$, $Y_C$) and ($X_D$, $Y_D$).

$$X_G = (F_A X_A + F_B X_B + F_C X_C + F_D X_D)/(F_A + F_B + F_C + F_D) \quad (1)$$

$$Y_G = (F_A Y_A + F_B Y_B + F_C Y_C + F_D Y_D)/(F_A + F_B + F_C + F_D) \quad (2)$$

As an example, the control unit 100 can calculate the coordinates ($X_G$, $Y_G$) of the center of gravity based on the equations (1) and (2) and detect the coordinates ($X_G$, $Y_G$) as an operation position on the operation panel 11.

(Vibration Providing Operation)

The control unit 100 can perform vibration proving control by driving the operation unit 10 (the operation panel 11) when, e.g., it is determined that a pressing or push-down operation has been performed.

The control unit 100 controls e.g., supply of the current I to the coil 35 at a predetermined timing. The supply of current to the coil 35 generates the solenoid magnetic field H passing through the coil 35. The magnetic field H forms a magnetic path through the side yoke 45b, the yoke main body 45a, the side yoke 45b, the air gap G, the magnetic member 15, the air gap G, and the side yoke 45b, as shown in FIG. 3C. As a result, the force f of attraction toward the yoke 45 acts on the magnetic member 15. This force f of attraction drives the operation unit 10 (the operation panel 11) downward against the operation deformation portion 21 and the elastic deformation portion 23. It is thereby possible to vibrate the operation unit 10 (the operation panel 11) and possible to provide tactile sensation to the operator.

(Configuration in the Second Embodiment)

Figure 7:
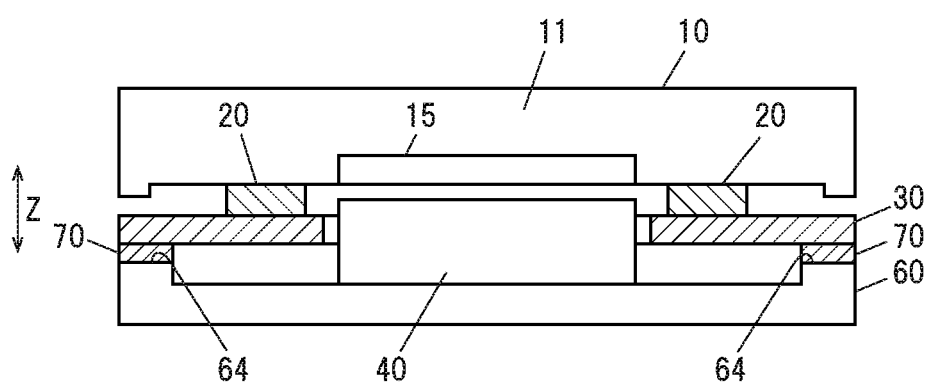
FIG. 7 is a cross-sectional view showing the input device in the second embodiment of the invention and corresponding to the cross section taken along B-B in FIG. 1.

The configuration in the second embodiment will be described. The operation unit 10 is supported by the substrate 30 via supports 20, as shown in FIG. 7. The substrate 30 is supported by and fixed to the edge 64 of the housing 60 via a support member 70. When the magnetic member 15 provided on the operation unit 10 receives a magnetic driving force (a magnetic attraction force) from the drive unit 40, the operation unit 10 is displaced in the vertical direction Z shown in FIG. 7 via vertical expansion and contraction of the supports 20 and the support member 70, and vibration thereby can be provided. The support member 70 can be formed of an elastic material such as silicone rubber.

The remaining configuration is the same as described above for the first embodiment. Since the substrate 30 is supported by the housing 60 via the support member 70, the second embodiment is effective in vibration providing operation by the drive unit 40. In this regard, since the substrate 30 and the drive unit 40 are supported by the housing 60 via the support member 70, vibration is provided by an inertial drive.

In addition, in the second embodiment, the yoke 45 is attached and fixed to the housing 60. In this configuration, the operation unit 10 provided with the magnetic member 15 can be directly driven from the housing 60.

(Effects of the Embodiments of the Invention)

The following effects are obtained by having the configuration described above.

(1) The input device 1 in the embodiments includes the operation unit 10 to receives an operation, the operation unit including a magnetic member 15 having magnetic properties, at least one load detection unit 25 that is for detecting a load on the operation unit 10 and detects the load according to capacitance between a pair of conductors, the substrate 30 on which the electrode 31 as one of the pair of conductors of the load detection unit 25 is arranged, and the drive unit 40 including a coil 35 to generate a magnetic field for driving the magnetic member 15, and it is configured that the coil 35 is arranged on the substrate 30. As a result, one substrate can be used for the operation position detection mechanism and the vibration providing mechanism and it is thus possible to achieve an input device in which the number of components can be reduced. In addition, since the structure is simple with less components, it is possible to reduce the thickness of the input device.

(2) By using the method based on the balance between the load detection units to detect the coordinates, one substrate can be used as the pattern coil substrate for solenoid and the substrate for sensor, which is advantageous in reducing the thinness and cost.

(3) Sensitivity of the capacitive load sensor can be improved by having the operation deformation portion 21.

(4) It is possible to simplify the structure by using one stick-on sensor sheet for the operation surface holding structure and the load sensing unit, which is advantageous in reducing the size and cost.

(5) By configuring the elastic body of the load detection unit to have a two-layer structure composed of the operation deformation portion 21 and the elastic deformation portion 23, the elastic body for load detection and the spring structure for vibration can be realized at the same position and the thickness can be reduced.

Although some embodiments and modifications of the invention have been described, these embodiments and modifications are merely examples and the invention according to claims is not to be limited thereto. These new embodiments and modifications may be implemented in various other forms, and various omissions, substitutions and changes, etc., can be made without departing from the gist of the invention. In addition, all combinations of the features described in these embodiments and modifications are not necessary to solve the problem of the invention. Further, these embodiments and modifications are included within the scope and gist of the invention and also within the invention described in the claims and the range of equivalency.

The input device 1 in the embodiments is arranged on, e.g., a floor console between a driver's seat and a front passenger seat of a vehicle, and can be used to perform an input operation while looking at a display unit provided on an instrument panel. The input device 1 is operated and an input operation is performed by a pressing operation, etc., at a predetermined position. Based on this, on-vehicle devices such as an air conditioner, a car navigation device, an audio device, etc., can be remotely controlled.

REFERENCE SIGNS LIST

1 INPUT DEVICE
10 OPERATION UNIT

15 MAGNETIC MEMBER
20 SUPPORT
21 OPERATION DEFORMATION PORTION
21a SILICON MATERIAL
22 DETECTION ELECTRODE
23 ELASTIC DEFORMATION PORTION
25 LOAD DETECTION UNIT
30 SUBSTRATE
31, 31A, 31B, 31C, 31D ELECTRODE
35 COIL
40 DRIVE UNIT
45 YOKE
60 HOUSING
70 SUPPORT MEMBER
100 CONTROL UNIT

The invention claimed is:

1. An input device, comprising:
an operation unit to receive an operation, the operation unit comprising a magnetic member having a magnetic property;
at least one load detection unit to detect a load on the operation unit and detect the load according to capacitance between a pair of conductors;
a substrate on which an electrode as one of the pair of conductors of the load detection unit is arranged; and
a drive unit comprising a coil to generate a magnetic field for driving the magnetic member,
wherein the coil is arranged on the substrate.

2. The input device according to claim 1, wherein the drive unit comprises the coil and a yoke through which the magnetic field generated by the coil passes.

3. The input device according to claim 1, wherein the load detection unit comprises the electrode, an operation deformation portion to deform in response to an operation on the operation unit, and a detection electrode as the other of the pair of conductors, and the electrode, the operation deformation portion and the detection electrode are located between the substrate and the operation unit and arranged in this order from the substrate.

4. The input device according to claim 1, further comprising an elastic deformation portion between the operation unit and the detection electrode.

5. The input device according to claim 1, wherein the operation deformation portion is configured to elastically deform.

6. The input device according to claim 5, wherein the operation deformation portion comprises a silicone gel.

7. The input device according to claim 1, wherein the substrate is supported by a housing.

8. The input device according to claim 1, wherein the substrate is supported by the housing via a support member having elasticity.

9. The input device according to claim 1, wherein the electrode and the coil are arranged on the same surface of the substrate.

10. The input device according to claim 1, further comprising a control unit that determines whether or not an operation is performed on the operation based on the load on the operation unit detected by the load detection unit, and causes the drive unit to drive the magnetic member when an operation is performed on the operation.

* * * * *